United States Patent [19]

Plachno et al.

[11] 4,360,903
[45] Nov. 23, 1982

[54] CLOCKING SYSTEM FOR A SELF-REFRESHED DYNAMIC MEMORY

[75] Inventors: Robert S. Plachno, Lewisville; Ching-Lin Jiang, Dallas, both of Tex.

[73] Assignee: Mostek Corporation, Carrollton, Tex.

[21] Appl. No.: 265,994

[22] PCT Filed: Sep. 10, 1980

[86] PCT No.: PCT/US80/01162
§ 371 Date: Sep. 10, 1980
§ 102(e) Date: Sep. 10, 1980

[87] PCT Pub. No.: WO82/00915
PCT Pub. Date: Mar. 18, 1982

[51] Int. Cl.³ .................................................. G11C 7/00
[52] U.S. Cl. ...................................... 365/222; 365/233
[58] Field of Search ................................ 365/222, 233

[56] References Cited

U.S. PATENT DOCUMENTS 3,684,897  8/1972  Anderson et al. ................... 365/222

FOREIGN PATENT DOCUMENTS 52-36433  3/1977  Japan.

OTHER PUBLICATIONS

Crabtree et al., "Dynamic Memory Refresh System", IBM Tech. Disc. Bul., vol. 21, No. 8, 1/79, pp. 3268-3270.

Sublette, "Random-Access Memory Array Refresh", IBM Tech. Disc. Bul., vol. 21, No. 7, 12/78, pp. 2897-2898.

Caywood et al., "A Novel 4K Static RAM with Submilliwatt Standby Power", IEEE Trans. on Electron Dev., vol. ED-26, No. 6, 6/79, pp. 861-864.

Primary Examiner—Stuart N. Hecker

[57] ABSTRACT

A clocking system for a self-refreshed dynamic memory (10) for reading data stored in a memory cell (30) and including clocking circuitry (68) includes detecting changes in an address signal (60). The method further includes generating a memory refresh signal (64, 66) in response to detecting changes in the address signal (60). The memory refresh signal (66) is applied to the semiconductor memory circuit (30) for refreshing data stored in the memory cells of the semiconductor memory circuit (30). After the application of the memory refresh signal (66) to the semiconductor memory circuit (30) the address signal (16) is applied to the semiconductor memory circuit (30) for accessing the addressed memory cell to thereby read the data stored therein. The clocking circuitry (68) is reset and precharged during the application of the refresh signal (66) to the semiconductor memory circuit (30).

4 Claims, 1 Drawing Figure

CLOCKING SYSTEM FOR A SELF-REFRESHED DYNAMIC MEMORY

TECHNICAL FIELD

This invention relates to random access memories, and more particularly to a method for clocking a self-refreshed dynamic random access memory.

BACKGROUND ART

Random access memories have been devised uitlizing metal-oxide-semiconductor field effect transistors (MOSFET) or other conductor-insulator-semiconductor field effect transistor integrated circuit technology. Random access memories can be formed from a large number of integrated semiconductor circuit chips each having a large number of binary data storage cells. Such memories have used binary bit storage cells comprised of several MOS transistors connected as a flip-flop to provide a static memory. Because of the relative complexity, size and power requirements of these static memory cells, random access memories utilizing dynamic storage cells with a smaller number of MOS transistors have been devised. The static type of memory cell includes cross coupled transistor stages wherein one or more paths to ground can be selectively switched on or off. In the dynamic type of memory cell, a charge is stored on a capacitor by operation of one or more transistors.

The time required to retrieve a particular bit of data from a random access memory, commonly referred to as the access time, is a critical factor in such memory systems. In accessing or reading static type cells, the column bus may be discharged substantially to zero by currents passing through the memory cell in order to detect a logic "zero" stored in the cell. In the systems utilizing dynamic memory cells which have destructive read cycles, data is read from the memory cell by detecting a voltage kick on the column bus as the capacitor of the memory cell is either charged or discharged when addressed. A typical characteristic of the dynamic memory cell is the requirement of a refresh of the cell voltage to maintain the data stored therein or to write data therein. Because the dynamic memory cell is small in size, high packing densities of cells can be achieved with resulting low power consumption of the random access memory. Additionally, dynamic memory cells can be fabricated utilizing a simpler process over the process required for the fabrication of static memory cells. Because of these described advantages and the disadvantages of requiring refresh cycles with the use of dynamic memory cells, self-refreshed dynamic memory cells have been developed. Such a cell operates so that the memory refresh is transparent to the user and the memory appears to be fully static.

In order to improve upon the layout area and power drain of static memory devices, pseudo-static random access memories have been proposed together with self-refreshing circuitry. A self-refreshing cell utilizing five transistors and dynamic sensing is described in a paper by Caywood et al. entitled "A Novel 4 K Static RAM with Submilliwatt Standby Power", *IEEE Transactions on Electron Devices*, Volume Ed.—26, No. 6, June 1979 at page 861. Such a pseudo-static cell being derived from a one-transistor, one-capacitor dynamic cell concept, causes the readout to be inherently destructive and therefore the cell must be refreshed after each read operation.

A need has thus arisen for an improved clocking system for a self-refreshed dynamic MOS memory cell. A need has further arisen for a self-refreshed dynamic memory cell which can be read in a nondestructive manner, such that the memory refresh is transparent to the user and the memory cell appears fully static.

DISCLOSURE OF THE INVENTION

In accordance with the present invention, a method for clocking a semiconductor storage device cell is provided wherein a self-refreshed dynamic random access memory cell is utilized.

In accordance with the present invention, a method for reading data stored in memory cells of a self-refreshed dynamic semiconductor memory circuit including clocking circuitry wherein the memory cells are addressed using an address signal is provided. The method includes detecting transitions in the address signal. A memory refresh signal is generated in response to the detection of changes in the address signal. The memory refresh signal is applied to the semiconductor memory circuit for refreshing data stored in the memory cells of the semiconductor circuit. After the application of the memory refresh signal, the address signal is applied to the semiconductor memory circuit for accessing the addressed memory cell to thereby read the data stored therein. The clocking circuitry is reset and precharged during refresh of the memory cells.

In accordance with another aspect of the present invention, a method for writing data into a memory cell of a self-refreshed dynamic semiconductor memory circuit wherein the memory cells are addressed utilizing a write-enable signal is provided. The method includes detecting the write-enable signal. Data is then written into the accessed memory cell. After writing data into the memory cell, the memory refresh signal is applied to the semiconductor memory circuit which serves as the refresh for a following address of the semiconductor memory circuit.

BRIEF DESCRIPTION OF DRAWINGS

For a more complete understanding of the present invention and advantages thereof, reference will now be made to the following Detailed Description taken in conjunction with the single FIG. 1 which is a block diagram of a random access memory utilizing the present clocking system.

DETAILED DESCRIPTION

Figure 1:
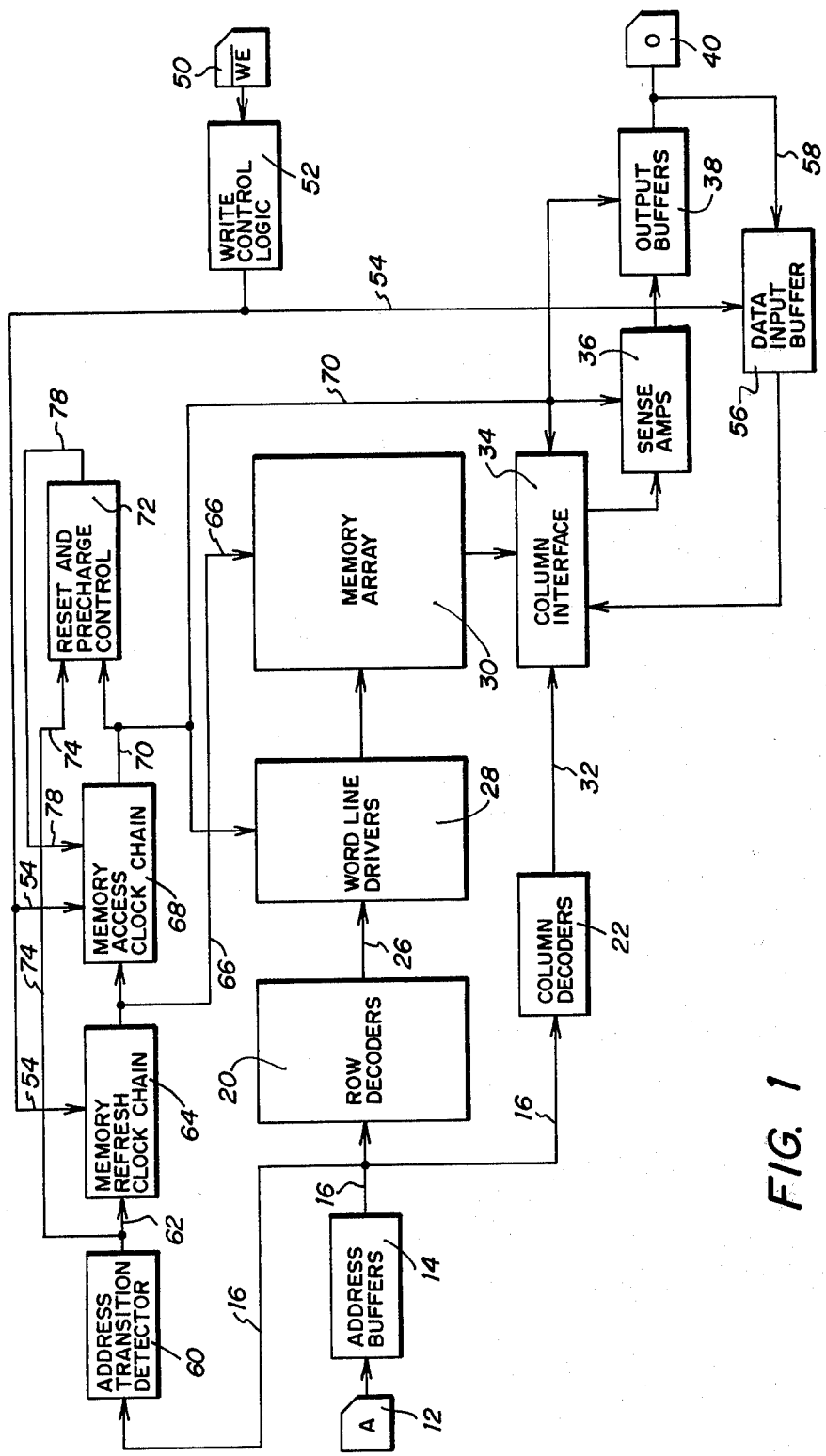

Referring to the single FIG. 1, a block diagram of a self-refreshed dynamic memory is illustrated and is generally identified by the numeral 10. The address to memory 10 is supplied to an address pad 12 whose output is applied to address buffers 14. Address buffers 14 receive the address signal and function to amplify the address signal for application via signal line 16 to row decoders 20 and column decoders 22. Row decoders 20 and column decoders 22 function to detect which bit in the memory array of memory 10 are to be accessed. Row decoders 20 provide an output via signal line 26 to word line drivers 28 to determine which word line of a memory array 30 of memory 10 is to be accessed. The output of column decoders 22 is applied via signal line 32 to a column interface 34. Word line drivers 28 require clocks in operation, to be subsequently described.

Address buffers 14, row decoders 20 and column decoders 22 are ripple-through static devices.

Memory array 30 may be comprised of a plurality of memory cells such as the memory cell described in co-pending U.S. patent application Ser. No. 117,223 filed Jan. 31, 1980 entitled "MOS Memory Cell" and assigned to the assignee of the present application. The output of memory array 30 is applied to column interface 34 which passes data from the bit lines of memory array 30 to sense amplifiers 36. The output of sense amplifiers 36 is applied to output buffers 38 for amplification and application to an output pad 40 of memory 10.

To access memory array 30 in order to perform a write operation, a write-enable signal is input on the write-enable pad 50 for application to write control logic 52. The output of write control logic 52 is applied via a signal line 54 to a data input buffer 56 which also receives the input data via pad 40 along signal line 58. The output of data input buffer 56 is applied to column interface 34.

The clocking or control system for memory 10 will now be discussed. The output of address buffers 14 is also applied via signal line 16 to an address transition detector 60. Address transition detector 60 generates a pulse for each transition in the address supplied to memory 10, indicating that an address has changed and a need to access different memory cells of memory array 30. The output of address transition detector 60 is applied via a signal line 62 to a memory refresh clock chain 64. Memory refresh clock chain 64 functions to generate the necessary clocking signals via signal line 66 to refresh the cells of memory array 30. This refresh takes place prior to access of the cells of memory array 30. It is only after this refresh that the output of memory refresh clock chain 64 is also applied to a memory access clock chain 68 which is capable of generating the necessary clocking signals via signal line 70 for application to word line drivers 28, column interface 34, sense amplifiers 36 and output buffers 38 to perform an access of a memory cell of memory array 30. Memory 10 is accessed only after memory access clock chain 68 is initiated by the output of memory refresh clock chain 64.

The output of memory access chain 68 is also applied to a reset and precharge control 72 which also receives the output of address translator detector 60 via signal line 74. Reset and precharge control 72 functions to provide an output via signal line 78 to memory access clock chain 68 to provide a reset and precharge for the logic clocks of memory access clock chain 68.

Memory refresh clock chain 64 may include, for example, clock generators described in co-pending International patent application Ser. No. PCT/US80/01163 filed Sept. 10, 1980, and entitled "Clock Generator" and assigned to the assignee of the present application.

During the write cycle of memory cell 10 utilizing the present method, data input buffer 56 receives data for application to column interface 34. Write control logic 52 via signal line 54 applies an output to memory refresh clock chain 64 and memory access clock chain 68 to initiate a refresh sequence of the memory cells of memory array 30 after data has been written into the cells of memory array 30.

The present clocking system, providing for refresh of memory cells of a self-refreshed dynamic memory before an access is made to the data contained therein, eliminates the need for a refresh after the data has been accessed. Since precharging and resetting of the memory access clock chain 68 occur during refresh, before an access to memory array 30, the total cycle time is equal to the access time unlike dynamic memories where the total cycle time is greater than the access time. With the method of the present invention if, during a memory access cycle, the user changes an address, since the memory array 30 of memory 10 has previously been refreshed on the initiation of the previous address, no additional refresh is necessary and memory array 30 can be accessed with the subsequently changed address. Therefore, it can be seen that the access time to perform a short cycle interrupt is less than the time for a noninterrupted cycle, since the reset and precharge time is shorter than the refresh time. By eliminating the need for refreshing memory array 30 on a short cycle, sufficient time is provided to precharge all the dynamic aspects of memory 10 and to reset and precharge memory 10 before a new access is initiated. Another aspect of the present invention provides for a refresh of memory array 30 immediately after data is written into a memory cell of memory array 30. The timing of this refresh allows the user to immediately follow a write cycle with a read cycle without the need for an additional refresh of memory array 30.

In summary, the present clocking system provides for a memory that is refreshed before it is accessed. The method has the advantage that on short cycle interrupts, the memory cells of the memory array do not need to be refreshed twice so that lost time in resetting and precharging the clock generators and related circuitry is compensated for by the time gained by not refreshing after each access. The access time for short cycle interrupts is less than the access time for a noninterrupted cycle. Additionally, sufficient time is provided on the front end of a cycle for precharging the clock generator. This time allows the cycle time to be equal to the access time. Additionally the method of the present invention providing for a refresh at the end of a write cycle permits this refresh to also serve as the refresh for a subsequently following read cycle. The dual nature of this refresh allows for a shorter write recovery time.

Whereas the present invention has been described with respect to specific embodiments thereof it will be understood that various changes and modifications will be suggested to one skilled in the art and it is intended to encompass such changes and modifications as fall within the scope of the appended claims.

We claim:

1. A method for reading data stored in a memory cell of a self-refreshed dynamic semiconductor memory circuit including clocking circuitry wherein the memory cells are addressed using an address signal comprising the steps of:

detecting changes in the address signal;

generating a memory refresh signal in response to detection of changes in the address signal;

applying the memory refresh signal to the semiconductor memory circuit for refreshing data stored in the memory cells of the semiconductor memory circuit;

after applying the memory refresh signal to the semiconductor memory circuit, applying the address signal to the semiconductor memory circuit for accessing the addressed memory cell to thereby read the data stored therein; and resetting and precharging the clocking circuitry during application of the refresh signal to the semiconductor memory circuit.

2. A method for reading data stored in a memory cell of a self-refreshed dynamic semiconductor memory circuit including clocking circuitry wherein the memory cells are addressed using an address signal comprising the steps of:

detecting a first address signal;

generating a memory refresh signal in response to detection of the first address signal;

applying the memory refresh signal to the semiconductor memory circuit for refreshing data stored in the memory cells of the semiconductor memory circuit;

after applying the memory refresh signal to the semiconductor memory circuit, detecting a second address signal;

applying the second address signal to the semiconductor memory circuit for accessing the second addressed memory cell to thereby read the data stored therein without generating an additional refresh signal; and resetting and precharging the clocking circuitry during application of the refresh signal to the semiconductor memory circuit.

3. The method of claim 2 and further including writing data into the memory cells wherein the memory cells are addressed utilizing a write-enable signal comprising the steps of:

detecting the write-enable signal;

writing data into a memory cell of the semiconductor memory circuit; and after writing data into the enabled memory cell, applying the memory refresh signal to the semiconductor memory circuit.

4. A method for reading data stored in a memory cell and writing data into a memory cell of a self-refreshed dynamic semiconductor memory circuit wherein the memory cells are addressed for reading using an address signal and addressed for writing using a write-enable signal comprising the steps of:

detecting the write-enable signal;

writing data into a memory cell of the semiconductor memory circuit;

after writing data into the enabled memory cell, applying the memory refresh signal to the semiconductor memory circuit;

detecting an address signal; and applying the address signal to the semiconductor memory circuit for accessing the addressed memory cell to thereby read the data stored therein without refreshing the memory circuit such that the refresh after the write cycle is shared with the memory access.

* * * * *